United States Patent [19]

Soneda et al.

[11] Patent Number: 4,466,018

[45] Date of Patent: Aug. 14, 1984

[54] IMAGE PICKUP APPARATUS WITH GAIN CONTROLLED OUTPUT AMPLIFIER

[75] Inventors: Mitsuo Soneda; Takashi Noguchi; Takaji Ohtsu, all of Tokyo, Japan

[73] Assignee: Sony Corporation, Tokyo, Japan

[21] Appl. No.: 379,959

[22] Filed: May 19, 1982

Related U.S. Application Data

[63] Continuation-in-part of Ser. No. 375,109, May 5, 1982.

[30] Foreign Application Priority Data

| May 9, 1981 [JP] | Japan | 56-69786 |
|---|---|---|
| May 20, 1981 [JP] | Japan | 56-74809 |
| May 20, 1981 [JP] | Japan | 56-78810 |

[51] Int. Cl.$^3$ ............................................. H04N 5/14
[52] U.S. Cl. ................................. 358/213; 358/212; 330/254
[58] Field of Search ............... 358/209, 212, 213, 241, 358/174, 184; 330/254, 278; 250/208, 209, 578

[56] References Cited

U.S. PATENT DOCUMENTS

| 4,233,630 | 11/1980 | Baker | 358/167 |
|---|---|---|---|
| 4,274,113 | 6/1981 | Ohba | 358/213 |
| 4,355,335 | 10/1982 | Imaide | 358/213 |

FOREIGN PATENT DOCUMENTS

1224833 1/1969 United Kingdom .
1303690 8/1970 United Kingdom .

Primary Examiner—Tommy P. Chin
Attorney, Agent, or Firm—Lewis H. Eslinger; Alvin Sinderbrand

[57] ABSTRACT

Solid-state image pickup apparatus, such as an MOS imager, has a two-dimensional array of picture element units each formed of a photo sensitive element and a gating element. The picture unit elements discharge a signal charge onto vertical and horizontal transmitting lines in response to vertical and horizontal scanning pulses. Then, a resulting signal current is used to develop an output video signal. In order to give the output video signal a good S/N ratio, a gain-controlled current amplifier is employed. In several embodiments, the gain-controlled amplifier includes first through fourth transistors with the base-emitter junctions of the first and second transistors and of the third and fourth transistors connected in series, with a constant current source coupled to the first transistor, controlled current sources connected to the second and third transistors, and a load device coupled to the fourth transistor. In other embodiments, the gain controlled amplifier is formed of first, second, and third current mirror circuits connected in a balanced-current arrangement. Electrically variable resistances, e.g., MOS transistors, are coupled to the output transistors of the first and second current mirror circuits to control the current gain.

23 Claims, 29 Drawing Figures

IMAGE PICKUP APPARATUS WITH GAIN CONTROLLED OUTPUT AMPLIFIER

RELATED APPLICATION DATA

This is a continuation-in-part of our application Ser. No. 375,109, filed May 5, 1982.

BACKGROUND OF THE INVENTION

This invention relates to gain-controlled amplifiers, and is more particularly directed to a solid-state image pickup device incorporating a gain-controlled current amplifier for converting a relatively feeble video signal to a strong video output signal with a high signal-to-noise (S/N) ratio.

A solid-state image pickup element, such as an MOS imager, generally provides a quite weak signal which must be amplified before being applied to a successive stage. This weak video signal is particularly susceptible to noise due to stray currents, shot noise, and the like. In an MOS imager, the video signal is provided as a differentiated current. This signal must be integrated to obtain an average value, but integration lowers the overall level of the video signal. Thus, the integrated signal has a rather low S/N ratio.

An external amplifier is conventionally provided to amplify the output signal and thereby convert it to a level suitable for further processing. Unfortunately, this external amplifier amplifies the noise along with the video signal, and, because it is external, also introduces noise. Consequently, the resulting video output signal has a further deteriorated S/N ratio.

Furthermore, the average level of the output signal from the image pickup element varies greatly with changes in brightness or color temperature of a scene to be televised. If the gain of the circuit connected to the pickup element is too high, the peak level becomes clipped and the signal waveform becomes distorted when a bright scene is being shot. As a result, the picture becomes washed out, and lacks detail in its bright portions. On the other hand, if the gain of the circuit is too low, the average signal level is reduced and the S/N ratio can become unacceptably low when a dark scene is shot. Obviously, both of the foregoing situations are undesirable. Consequently, it would be advantageous to include a gain control element in the video signal processing circuitry so that the gain of the output circuitry associated with the pickup element changes in accordance with the brightness of the picture being picked up.

Unfortunately, conventional gain-controlled amplifiers generally are suitable only for amplifying a continuous analog signal, and no such circuit has been previously proposed which can control the amplitude of a sampled, time-shared current signal such as the output of an MOS imager or other similar image pickup device.

OBJECTS AND SUMMARY OF THE INVENTION

It is an object of this invention to provide video image pickup apparatus generating a strong video signal representing a scene with a high signal-to-noise ratio, the level of which signal is controlled in accordance with brightness conditions of the scene.

It is another object of the invention to provide video image pickup apparatus incorporating a current amplifier therein to avoid the aforementioned problems that occur when an external amplifier is used to amplify the video signal.

It is a more specific object to provide video image pickup apparatus employing a gain-controlled current amplifier of a type suitable for amplifying a sampled, time-shared current signal typical of the output of a solid-state imager.

According to an aspect of this invention, image pickup apparatus are provided in which there are a plurality picture element units, each formed of a photosensitive member generating a quantum of electrical charge depending on the amount of light falling thereon and an electrically controlled gating circuit for transmitting the generated amount of charge in response to scanning pulses applied thereto, with the picture element units being disposed in a two-dimensional array of horizontal rows and vertical columns. Scanning signal generators sequentially provide horizontal and vertical scanning pulses to the gating circuits of the respective picture element units, so that the electrical charges are presented, in row-by-row sequence, to an output circuit to produce a video signal. In embodiments of this invention, the output circuit includes a gain-controlled current amplifier circuit formed of an input transistor to which the input signal current is applied and an output transistor at which an amplified output signal current appears. The gain of the circuit, i.e., the ratio of the output signal current to the input signal current, is controlled by a controllable element coupled to the input and output transistors so that the current gain can be selectively controlled, in accordance with illuminating conditions of a scene being shot by means of a control signal applied thereto.

In several embodiments the gain-controlled amplifier includes first, second, third, and fourth transistors each having a first and a second current-carrying electrode and a control electrode, with the second and third transistors having their first current-carrying electrodes coupled together to a point of voltage, having their control electrodes coupled together to the first current-carrying electrode of the first transistor, and having their second current-carrying electrodes coupled to the control electrodes of the first and fourth transistors, respectively. The first and fourth transistors have their second current-carrying electrodes coupled together to another point of voltage. A current source supplies a constant current to the first current-carrying electrode of the first transistor, and a load device is coupled to the first current-carrying electrode of the fouth transistor. An adjustable current source supplies adjustable constant currents to the second current-carrying electrodes of the second and third transistors. In these embodiments, the input signal current is applied to the first current-carrying electrode of the first transistor and the output signal current appears at the first current-carrying electrode of the fourth transistor.

In other embodiments, the gain controlled current amplifier can include first, second, and third current mirror circuits, each having an input transistor device and an output transistor device. Current sources provide substantially constant currents to the input transistor devices of the first and second current mirror circuits; while the output transistor devices thereof are respectively coupled to the output and input transistor devices of the third current mirror circuit. First and second resistive elements, which can include the source-to-drain resistances of MOS transistors, are coupled to the input transistor devices of the first and second current mirror circuits. Third and fourth resistive elements, which can also include MOS transistors, are adjustable by means of a gain control voltage applied thereto, and are coupled to the output transistor devices of the first and second current mirror circuits. A load device is coupled to the output transistor device of the first current mirror circuit. Here, the input signal current is applied to the input transistor device of the first current mirror circuit and the output signal current appears at the output transistor of the first current mirror circuit.

In many embodiments, the load device can include a load capacitor having one plate coupled to the second current-carrying electrode of the second transistor and another plate coupled to a reference point, and a precharging transistor for charging the one plate of the load transistor during occurrences of a switching pulse.

The above and many other objects, features, and advantages of this invention will become apparent from the ensuing description of several preferred embodiments thereof, which is to be considered in connection with the accompanying drawings.

DETAILED DESCRIPTION OF SEVERAL PREFERRED EMBODIMENTS

Initially, for purposes of background and to emphasize the advantages of this invention, a conventional solid-state image sensor will be described with reference to FIG. 1.

In this conventional image sensor, an MOS (Metal-Oxide-Semiconductor) imager 1 is constituted by a plurality of picture element units $S_{011}$ to $S_{Enm}$ disposed in a two-dimensional, or X-Y array formed of m horizontal rows by n vertical columns.

A horizontal scanning circuit 2 provides successive horizontal gating pulses $\phi_{H1}$ (FIG. 2A), $\phi_{H2}$ (FIG. 2B), ... to $\phi_{Hm}$ (FIG. 2C) to the picture element units of each horizontal row in turn. At the same time, a vertical scanning circuit 3 provides interlaced odd and even vertical gating pulses $\phi_{V01}$ (FIG. 2D), $\phi_{V02}$ (FIG. 2E) ... $\phi_{VE1}$, $\phi_{VE2}$, ... $\phi_{VEn}$. The interlacing of the vertical gating pulses corresponds to the interlacing of a television image, in which a field of odd lines and a field of even lines alternate.

In this image sensor, each of the m picture element units $S_{011}$, $S_{012}$, ... $S_{01m}$ for the first odd line are disposed in line in the horizontal direction, and the picture element units for the remaining lines are similarly disposed.

Each of the picture element units $S_{011}$, $S_{012}$, ..., $S_{01m}$, ... $S_{Enm}$ is formed of a photo diode $D_{011}$, $D_{012}$ ..., $D_{01m}$, ... $D_{Enm}$, which can be a PN or PIN type, and an associated MOS gating transistor $M_{011}$, $M_{012}$, ..., $M_{01m}$, ... $M_{Enm}$. The photodiodes have their cathodes connected in common to a target voltage source $V_T$ and have their anodes coupled to the source electrode of the associated MOS gating transistors $M_{011}$, $M_{012}$, ... $M_{01m}$, $M_{Enm}$. The drain electrodes of these transistors are connected to respective vertical transmitting lines $L_{V1}$, $L_{V2}$, ... $L_{Vm}$, for each vertical column (i.e., for each successive horizontal position) while the gate electrodes of the MOS gating transistors of each particular horizontal row are connected in common to an output of the vertical scanning circuit 3 to receive a particular scanning pulse $\phi_{V01}$, $\phi_{V02}$ ... $\phi_{VEn}$ in accordance with the particular image line to be scanned. For example, the scanning signal $\phi_{V01}$ of FIG. 2D is furnished to the gate terminals of the transistors $M_{011}$ to $M_{01m}$ of the first odd horizontal row during a first horizontal scanning period.

The remaining odd lines and all of the even lines of the picture element units $S_{011}$, $S_{012}$ ... $S_{01m}$, ... $S_{Enm}$ are constituted in like manner.

Consequently, an odd field of video is generated in response to feeding of odd vertical scanning pulses $\phi_{V01}$, $\phi_{V02}$ ... to the gate electrodes of the transistors $M_{011}$, $M_{012}$, ... $M_{01m}$; $M_{021}$, $M_{022}$ ... $M_{02m}$ in the sequential odd horizontal rows, and an even field of video is generated in response to feeding of even vertical scanning pulses $\phi_{VE1}$, $\phi_{VE2}$ ... $\phi_{VEn}$ to the gate electrodes of the transistors $M_{E11}$, $M_{E12}$ ... $M_{E1M}$ ... $M_{Enm}$ of the sequential even rows.

Each vertical transmitting line $L_{V1}$, $L_{V2}$, ... $L_{Vm}$ has associated with it a capacitance $C_V$ for storing the electric charge passed by the gating transistors $M_{011}$, $M_{011}$ ... $M_{01m}$ ... $M_{Enm}$ in response to each particular vertical scanning pulse $\phi_{V01}$ to $\phi_{VEn}$, so that the capacitances $C_V$ at any line interval hold the electrical charge generated in one particular horizontal row of picture element units $S_{011}$ to $S_{01m}$, ..., $S_{En1}$ to $S_{Enm}$.

Each of the vertical transmitting lines $L_{V1}$ to $L_{Vm}$ also includes a respective MOS transistor $M_1$, $M_2$, ... $M_m$ having a source electrode coupled to the associated capacitance $C_V$, and having a gate electrode coupled to a respective output of the horizontal scanning circuit 2 to receive a particular horizontal scanning pulse $\phi_{H1}$, $\phi_{H2}$ ... $\phi_{Hm}$. The drain electrodes of the MOS transistors $M_1$ to $M_m$ are connected in common to a horizontal output transmitting line $L_H$. A capacitance $C_H$ is associated with the horizontal transmission line $L_H$, while a load resistor 4 of a value $R_L$ bridges between a DC voltage source $V_{DC}$ and the horizontal transmitting line $L_H$.

Here, the capacitances $C_H$ and $C_V$ are shown as lumped values, but in practice they are substantially distributed over the respective transmitting lines $L_H$ and $L_{V1}$ to $L_{Vn}$.

The horizontal output transmitting line $L_H$ is also coupled to a gate electrode of an output MOS transistor 5 connected as a source follower and serving as an isolation stage, with its drain electrode connected to a drain potential $V_{dd}$ and its source electrode connected to voltage source 6 and also to a pre-amplifier 7 to amplify the video signal and provide the same to an output terminal 8.

In this MOS imager 1, light incident on the diode $D_{011}$ to $D_{Enm}$ of each picture element unit $S_{011}$ to $S_{Enm}$ causes the diodes to generate electron-hole pairs. Consequently, a signal charge $Q_S$ is stred between the gate and source electrodes of each respective MOS gating transistor $M_{011}$ to $M_{Enm}$. The size of each signal charge $Q_S$ depends on the strength of the light incident on the particular diode $D_{011}$ to $D_{Enm}$.

Occurance of the vertical scanning signals $\phi_{V01}$, $\phi_{V02}$, ... $\phi_{VEn}$ places at a high level all of the gate electrodes of the gating transistors $M_{011}$ to $M_{01m}$; $M_{021}$ to $M_{02m}$; ...; $M_{Em1}$ to $M_{Enm}$ for one particular horizontal row. As a result, all of the signal charges $Q_S$ for the picture element units $S_{011}$ to $S_{01m}$; $S_{021}$ to $S_{02m}$; ... $S_{En1}$ to $S_{Enm}$ of that particular row are gated to the capacitances $C_V$ for the respective vertical transmission lines $L_{V1}$ to $L_{Vm}$.

Figures 2A, 2B:
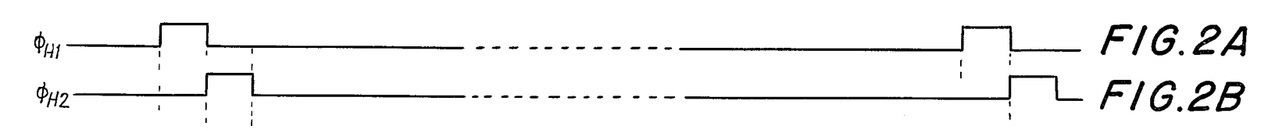
FIGS. 2A to 2G are waveform charts of scanning pulse signals used in conjunction with the image sensor of FIG. 1.
Figure 2C:
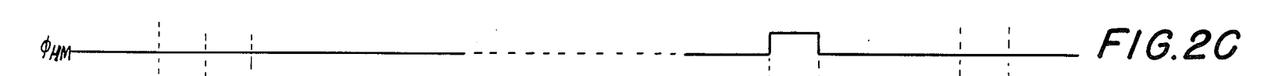

As shown in FIGS. 2A to 2C, the horizontal scanning pulses $\phi_{H1}$ to $\phi_{Hm}$ go from low to high levels at times $t_2$, $t_3$ ... $t_0$ and return to their low levels so as not to overlap one another. However, each such scanning pulse $\phi_{H1}$ to $\phi_{Hm}$ is of a sufficient length to transfer the charge $Q_S$ from each capacitance $C_V$ to the capacitance $C_H$.

Figure 2D:
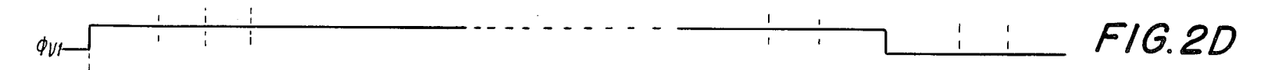
Figure 2E:
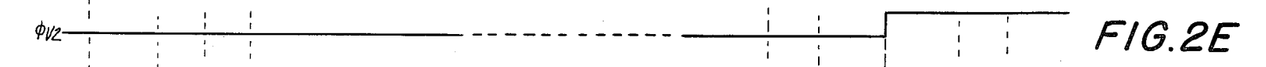

As shown in FIGS. 2D and 2E, the vertical scanning pulse $\phi_{V01}$ is high from a time $t_1$ until a later time $t_4$, at which time the next vertical scanning pulse $\phi_{V02}$ becomes high. In fact, all of the vertical scanning pulses $\phi_{V01}$ to $\phi_{VEn}$ are provided in a non-overlapping fashion.

If it is assumed that the pulse width of each horizontal scanning pulse $\phi_{H1}$ to $\phi_{Hm}$ is $\tau$, the time $t_2$ that the first scanning signal $\phi_{H1}$ is made high occurs a predetermined time after the time $t_1$ or $t_4$ following the onset of each vertical scanning pulse $\phi_{V01}$ to $\phi_{VEn}$.

Figure 2F:
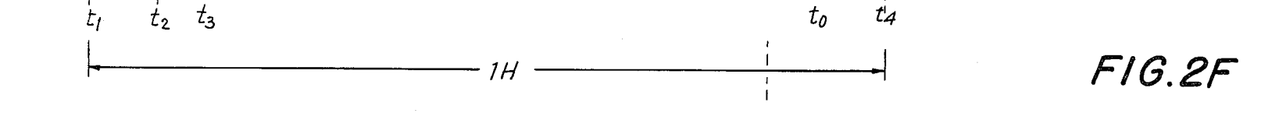

As aforementioned, each transmitting line $L_H$ and $L_{V1}$ to $L_{Vn}$ has a respective capacitance $C_H$ and $C_V$; the load resistor 4 has a resistance value $R_L$. The signal charge $Q_S$ stored in each picture element unit $S_{011}$ to $S_{Enm}$ generates a signal current $i_S$ (FIG. 2F) to flow whenever the associated horizontal and vertical scanning pulses are high. For the charge $Q_{S011}$ of the picture element $S_{011}$, these pulses are both high from the times $t_2$ to $t_3$ (FIG. 2A). Thus, the signal current $i_S$ associated with this particular picture element unit $S_{011}$ can be expressed $$i_S = \frac{Q_{S011}}{R_L(C_V + C_H)} \cdot \exp-\left(\frac{t}{R_L(C_V + C_H)}\right). \quad (1)$$

The resulting output voltage $V_{out}$ at the input to the preamplifier 7 becomes $$V_{out} = \frac{Q_{S011}}{C_V + C_H} \cdot \exp-\left(\frac{t}{R_L(C_V + C_H)}\right) \quad (2)$$

Here, it is important that the time constant $R_L(C_V+C_H)$ be sufficiently small that all of the charge $Q_S$ is transferred during each on period ($\tau = t_2 - t_1$) of the horizontal scanning pulses $\phi_{H1}$ to $\phi_{Hn}$. That is, for a value k defined by the equation $$R_L(C_V + C_H) = \frac{\tau}{k} \quad (3)$$

be rather larger than unity, for example $k = 5$.

The same requirement holds true for all the picture element units $S_{011}$ to $S_{Emn}$. For example, for the signal charge $Q_{S012}$ of the picture element $S_{012}$, the output voltage $V_{out}$ becomes $$V_{out} = \frac{Q_{S012}}{C_V + C_H} \cdot \exp\left(-\frac{t}{R_L(C_V + C_H)}\right) \quad (4)$$

Thus, as each unit $S_{011}$ to $S_{0nm}$ and $S_{E11}$ to $S_{Enm}$ is sequentially scanned, its respective signal charge $Q_{S011}$ to $Q_{SEnm}$ and $Q_{SE11}$ to $Q_{SEnm}$ flows through its associated vertical signal transmitting line $L_{V1}$ to $L_{Vm}$, and then through the horizontal transmitting line $L_H$ and the load resistor 4 as a signal current $i_S$, which is used to derive the video signal as the output voltage $V_{out}$.

Figure 2G:
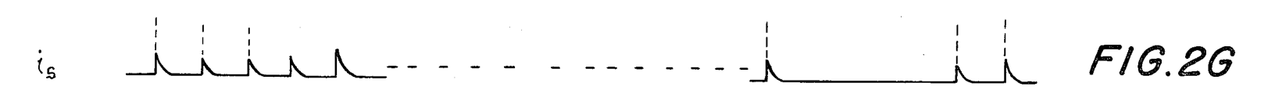

However, it is clear from FIG. 2G and from equations (2) and (4) above that the output voltage $V_{out}$ is a differential voltage, and cannot, with satisfactory results, be used directly as a stable input for a sample-hold or peak-hold circuit. Therefore, it is generally necessary to produce an average, or mean value of the output voltage $V_{out}$ by use of an integrator or low-pass filter. This results in a average output voltage $[V_{out}]_{mean}$ as expressed $$[V_{out}]_{mean} = \frac{Q_S}{C_V + C_H} \frac{1}{\tau} \int_0^\tau \exp\left(\frac{t}{R_L(C_V + C_H)}\right) dt \quad (5)$$

$$= \frac{Q_S}{C_V + C_H} \cdot R_L(C_V + C_H) \times$$

$$\left[\exp-\frac{t}{R_L(C_V + C_H)}\right] \cdot \frac{1}{\tau}$$

$$= \frac{Q_S \cdot R_L}{\tau} (1 - e^{-k})$$

Here, k is set at $k \geq 5$ as was true in equation (3) so that the factor $e^{-k}$ can be disregarded. If the signal charge $Q_S$ is thought of as being the product of the signal voltage $V_S$ times the gate-to-source storage capacitance $C_0$ of a particular picture element unit S, and the discharge time thereof is represented by the expression $k \geq R_L(C_V + C_H)$ from equation (3), then the average output voltage $[V_{out}]_{means}$ becomes $$[V_{out}]_{mean} = \frac{C_0 \cdot R_L \cdot V_S}{k R_L(C_V + C_H)} \quad (6)$$

$$= \frac{C_0}{k(C_V + C_H)} \cdot V_S$$

As k is large compared to unity, and the capacitance $C_0$ is small compared to the capacitances $C_V$ and $C_H$, it becomes readily apparent from equation (6) that the mean value $[V_{out}]_{mean}$ is extremely low. Therefore, the preamplifier 7 is required to have both a high gain and a high S/N ratio, and, consequently, is quite expensive.

Further, in a usual MOS imager, the circuit elements from the light-receiving portion 1 to the source-follower transistor 5 are integrated onto a single IC chip, and the preamplifier 7 is an external device connected to the transistor 5. Outside noise, such as clock noise, is likely to be introduced at the input of the preamplifier 7. Also, because the average value signal $[V_{out}]_{mean}$ is so small, it is easily affected by outside noise, and the S/N ratio suffers greatly.

One possible approach to improving the signal strength of the output signal $[V_{out}]_{mean}$ has been to make the value k small (k≈1), i.e., correspondingly to increase the value $R_L$ of the load resistor 4. However, if the resistor 4 is too large, the complete signal charge $Q_S$ for each picture element unit S will not be entirely transmitted during a single horizontal scanning pulse period $\tau$, and there is noticeable deterioration in both horizontal and vertical resolution.

Figure 1:
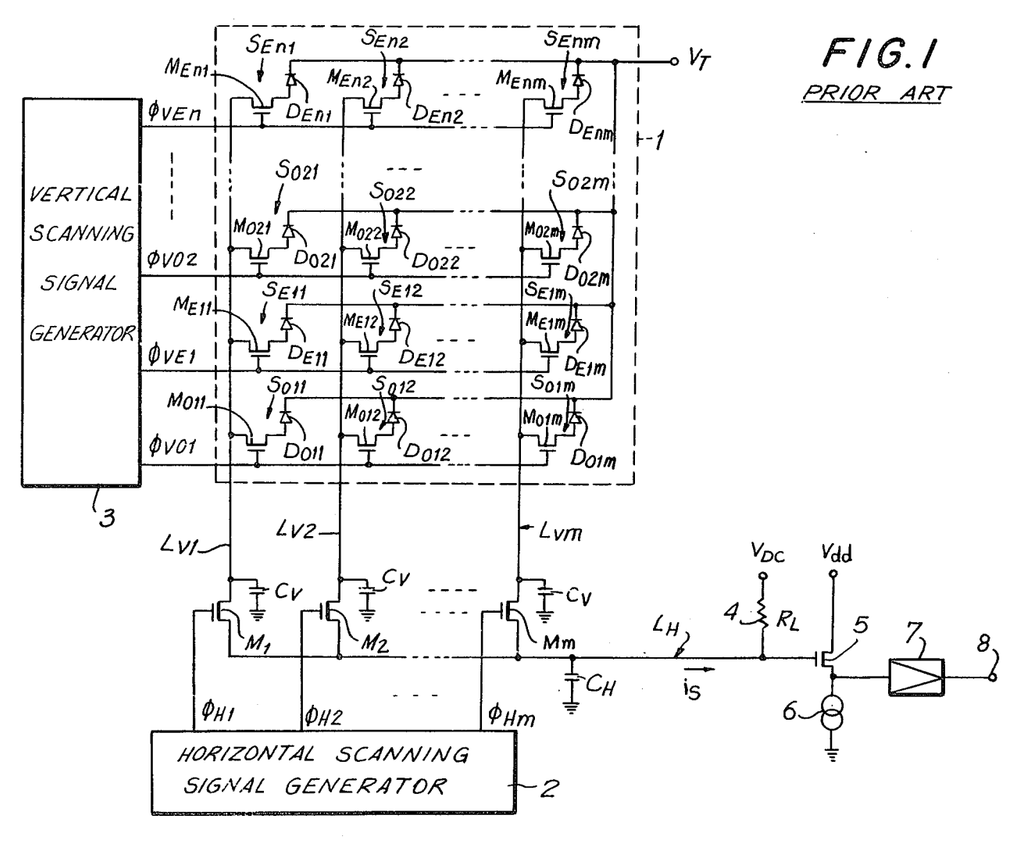
FIG. 1 is a schematic diagram of a conventional solid-state image sensor.
Figure 3:
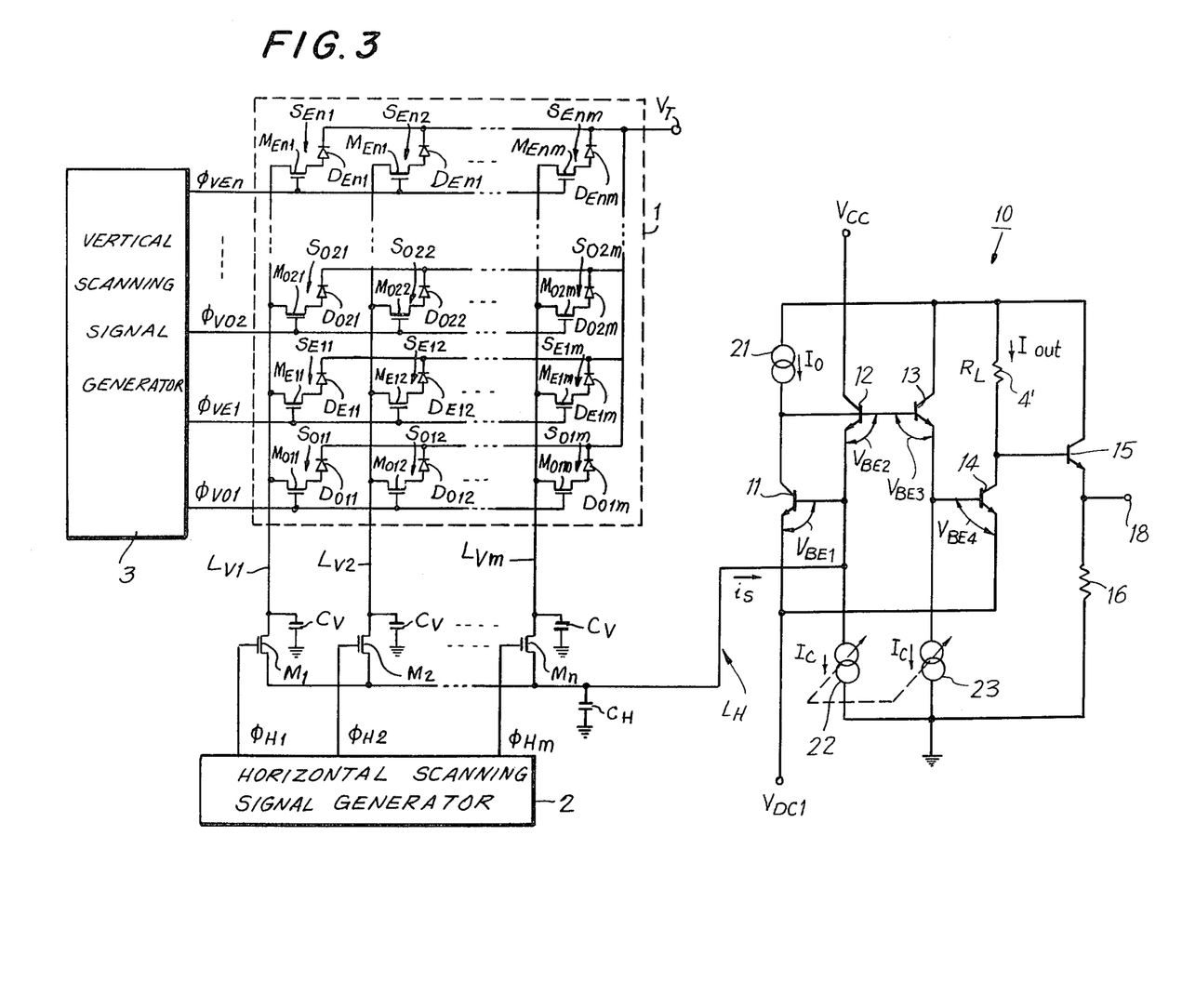
FIG. 3 is a diagram of a first embodiment of the improved image sensor according to the present invention.

A first embodiment of this invention is shown in FIG. 3, wherein elements common to the circuit of FIG. 1 are identified with the same reference characters, and a detailed description thereof is omitted.

Here, instead of the load resistor 4, the source follower 5, and the preamplifier 7, the horizontal signal transmitting line $L_H$ ends in a gain-controlled current amplifying circuit 10.

This gain-controlled amplifying circuit 10 includes first, second, third, and fourth junction transistors 11, 12, 13, and 14, each of which in this embodiment is an NPN transistor. The second and third transistors 12, 13 have their bases joined together to the collector of the first transistor 11 and have their collectors coupled to a source of collector voltage $V_{CC}$. The first and fourth transistors 11, 14 have their emitters connected to another point of voltage $V_{DC1}$ and have their bases connected to the emitters of the second and third transistors 12, 13, respectively. A load resistor 4' of value $R_L$ bridges between the source of collector voltage $V_{CC}$ and the collector of the fourth transistor 14. An isolation stage formed of an emitter follower transistor 15 and an emitter resistor 16 couples the collector of the fourth transistor 14 to an output terminal 18.

A current source 21 connected between the source of collector voltage $V_{CC}$ and the collector of the first transistor 11 furnishes a constant current $I_0$ thereto. A pair of controllable current sources 22 and 23 coupled between ground and the emitter of the second and third transistors, respectively, provide controllable constant emitter currents $I_C$ to the latter transistors. Preferably, the constant emitter currents $I_C$ have equal values, and both sources 22 and 23 are ganged together so that, when adjusted, the respective emitter currents $I_C$ remain equal.

Here, the input signal current $i_s$ is applied to the base of the first transistor 11 and an amplified output signal current $i_{sout}$ appears at the collector of the fourth transistor 14.

The operation of the circuit 10 as a gain-controlled current amplifier can be explained as follows:

The base-emitter junctions of the transistors 11 and 12 are connected in series and those of the transistors 13 and 14 are likewise connected in series, with the bases of the transistors 12 and 13 joined and the emitters of the transistors 11 and 14 joined. Consequently, the base-emitter forward voltages $V_{BE1}$, $V_{BE2}$, $V_{BE3}$, and $V_{BE4}$ of the first through fourth transistors 11, 12, 13, 14, respectively will have the relationship $$V_{BE1} + V_{BE2} = V_{BE3} + V_{BE4} \tag{7}$$

In general, the base-emitter voltage $V_{BE}$ of a junction transistor is logarithmically related to the emitter current $I_E$ flowing these through and emitter area A thereof:

$$V_{BE} \propto \ln (I_E/A) \tag{8}$$

Using the above relationships (7) and (8), if the transistors 11 to 14, respectively, have emitter currents $I_1$ to $I_4$ and emitter areas $A_1$ to $A_4$, the following relationship results:

$$\frac{I_1 \cdot I_2}{A_1 \cdot A_2} = \frac{I_3 \cdot I_4}{A_3 \cdot A_4} \tag{9}$$

In the embodiment of FIG. 3, the emitter current $I_1$ is substantially the same as the constant collector current $I_0$ provided from the current source 21. Also, the emitter current $I_2$ is equal to the difference between the constant current $I_C$ and the input signal current $i_s$ ($I_3 = I_c - i_s$) while the emitter current $I_3$ is equal to the constant current $I_c$. Since the emitter current $I_4$ for the fourth transistor 14 is substantially equal to its collector current $I_{out}$, the relationship (9) above can be rewritten $$\frac{I_0(I_c - i_s)}{A_1 \cdot A_2} = \frac{I_c \cdot I_{out}}{A_3 \cdot A_4} \tag{10}$$

The output current $I_{out}$ is then $$I_{out} = \frac{A_3 \cdot A_4}{A_1 \cdot A_2} \cdot I_0 - \frac{I_0}{I_c} i_s \tag{11}$$

The output voltage $V_{out}$ at the junction of the collector of the transistor 14 with the load resistor 4' becomes $$V_{out} = V_{cc} - R_1 \cdot I_{out} - V_{BE} \tag{12}$$

This output voltage $V_{out}$ has an AC signal component $V_{out}$ $$V_{out} = -R_L \frac{A_3 \cdot A_4}{A_1 \cdot A_2} \left( -\frac{I_0}{I_C} \right) \cdot i_s \tag{13}$$

obtained by substituting the above relationship (11) into the relationship (12), and considering only terms including the input signal current $i_s$. Furthermore, by using an integrator or low pass filter, an average signal voltage $[V_{out}]_{means}$ can be obtained having a value $$[V_{out}]_{mean} = \frac{A_3 \cdot A_4}{A_1 \cdot A_2} \cdot \frac{I_0}{I_C} \cdot R_L \times \tag{14}$$

$$\frac{Q_S}{r_{e2}(C_V + C_H)} \cdot \exp\left[-\frac{Q_S}{r_e(C_V + C_H)}\right] dt \cdot \frac{1}{\tau}$$

In equation (14), $r_{e2}$ is the resistance value at the emitter of the transistor 12, and can be determined by the relationship $$r_{e2} = \frac{kT}{qI_c} \approx \frac{26\text{mV}}{I_c}$$

where $Q_s$ is the signal charge stored on any given picture element unit $S_{011}$ to $S_{Emn}$, k is Boltzmann's constant, and T is the absolute Kelvin temperature of the base emitter junction of the transistor 12.

If a scanning period for the picture element units $S_{011}$ to $S_{Emn}$ is selected to satisfy the relationship $$\tau >> r_{e2}(C_V + C_H) \tag{15}$$

equation (14) above becomes $$[V_{out}]_{mean} = \frac{A_3 \cdot A_4}{A_1 \cdot A_2} \cdot \frac{I_O}{I_C} \cdot R_1 \cdot \frac{Q_S}{\tau} \tag{16}$$

As is apparent from the relationship (15) above, the rate of transfer of the signal charge $Q_S$ from the vertical and horizontal signal transmitting lines $L_{V1}$ to $L_{Vm}$ and $L_H$ is essentially determined by the value of the emitter resistance $r_{e2}$ of the transistor 12. The rate of charge transfer is independent of the resistance value $R_L$ of the load resistor 4'. Consequently, even when the value $R_L$ of the resistor 4' is large and the gain of the circuit 10 is high, the deleterious effects of the prior art, such as loss of resolution, do not occur. Also, because the signal current $i_s$ can be amplified directly to obtain a large amplitude voltage signal $v_s$, the S/N ratio for the entire image pickup apparatus is greatly improved. Furthermore, in accordance with the relationship (16) above, if the transistors 11 to 14 have their emitter areas $A_1$ to $A_4$ selected to satisfy the relation $$A_3 \cdot A_4 \geq A_1 \cdot A_2$$

and the constant currents $I_0$ and $I_C$ are selected $$I_0 > I_C,$$

the average output voltage $[V_{out}]_{mean}$ can be amplified and the gain of the circuit 10 changed simply by controllably changing the value of the constant current $I_C$.

Figure 4:
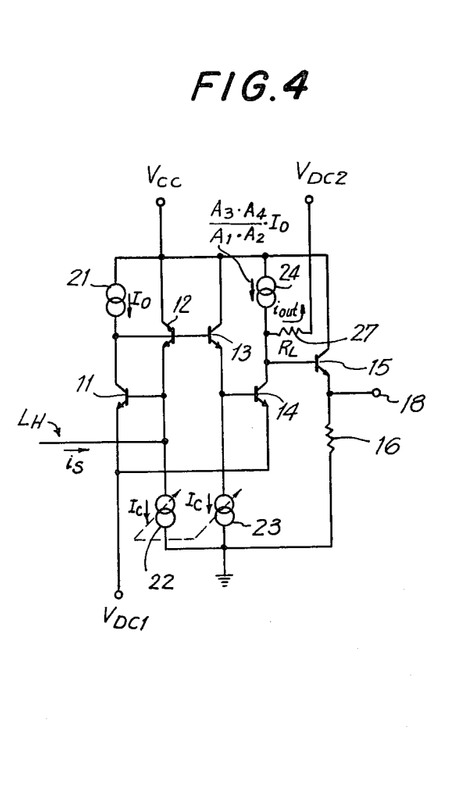
FIG. 4 is a schematic diagram of a pertinent portion of the improved image sensor according to a second embodiment thereof.

A second embodiment of this invention is illustrated in FIG. 4. In this embodiment, circuit elements that are also shown in FIG. 3 are identified with the same characters, and a detailed description thereof is omitted. Here, an additional current source 24 is connected between the source of collector voltage $V_{CC}$ and the collector of the transistor 14. A load resistor 27 having a value $R_L$ is connected between the collector of the transistor 14 and a point of reference potential $V_{DC2}$. The additional current source 24 provides a constant current $I_{4C}$ to the transistor 14 so that an output signal current $i_{out}$ having only AC signal components flows through the load resistor 27.

In other words, the emitter current $I_{4C}$, which is substantially equal to the collector current thereof, is equal to the output current $I_{out}$ in the relation (11) above, and can be expressed as follows:

$$I_4 = \frac{A_3 \cdot A_4}{A_1 \cdot A_2} \cdot \left( I_0 - \frac{I_0}{I_C} \cdot i_s \right) \tag{17}$$

However, if the constant current source 24 supplies to the collector of the transistor 14 a constant DC current corresponding to the DC component of the current $i_{out}$ of the relationship (17) above, the current flowing through the load resistor 27 becomes $$i_{out} = \frac{A_3 \cdot A_4}{A_1 \cdot A_2} \cdot I_O - I_4 \tag{18}$$

$$= \frac{A_3 \cdot A_4}{A_1 \cdot A_2} \cdot \frac{I_O}{I_C} \cdot i_s$$

As is apparent, this output current $i_{out}$ has only AC signal components. Consequently, the output voltage $v_{out}$ in equation (13) above, which is the AC component of the output signal $V_{out}$ can be obtained directly at the collector of the transistor 14, and its average value can be obtained according to equation (16) above.

In this case, the constant current supplied from the current source 24, will have the value $$I_4 = \frac{A_3 \cdot A_4}{A_1 \cdot A_2} \cdot I_O$$

Figure 5:
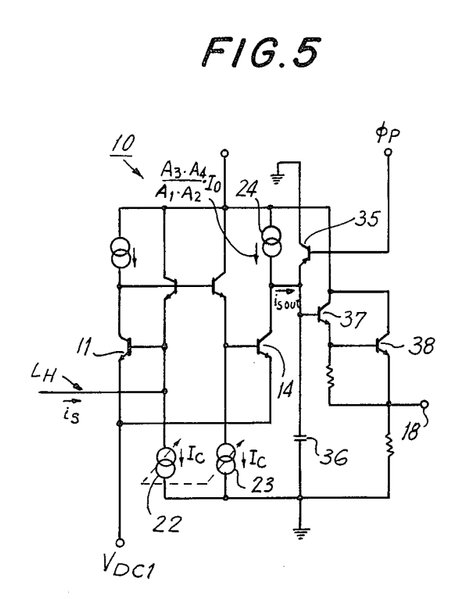
FIG. 5 is a schematic diagram of a pertinent portion of the improved image sensor according to a third embodiment thereof.

A third embodiment of this invention is illustrated in FIG. 5, in which elements shared with the embodiment of FIG. 4 are identified with the same reference characters. In this embodiment, in place of a load resistor, the collector of the transistor 14 is connected to one plate of load capacitor 36 having a capacitance of $C_P$, another plate of which is connected to ground. A PNP charging transistor 35 has its emitter connected to the one plate of the capacitor 36, its collector connected to ground, and its base connected to receive precharge pulses $\phi_p$. The one plate of the capacitor 36 is also coupled through an output stage formed of a Darlington arrangement of NPN transistors 37 and 38 to the output terminal 18.

Figures 6A, 6B:
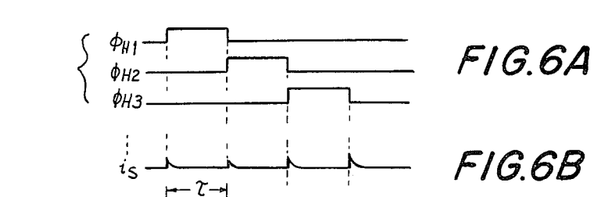
FIGS. 6A to 6F are waveform charts for explaining operation of the third embodiment.
Figures 6C, 6D:
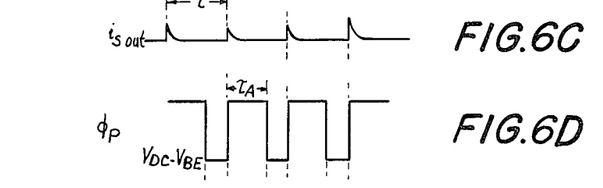
Figure 6E:
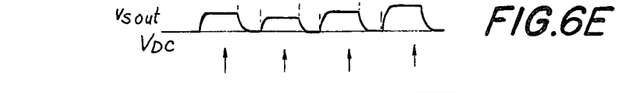

Here, at the onset of each of the horizontal scanning signals $\phi_{H1}$, $\phi_{H2}$, $\phi_{H3}$ (FIG. 6A), the signal charge $Q_s$ stored in each picture element unit $S_{011}$ to $S_{Emn}$ is transferred through the transmitting line $L_V$ and $L_H$ and appears a differentiated signal current $i_s$ (FIG. 6B). In this embodiment, both the input signal $i_s$ and the output signal current $i_{sout}$ (FIG. 6C) are both positive, as the latter represents a charging of the load capacitor 36. Thus, it is required to preset the load capacitor 36 to a constant initial low value, such as ground potential. For this reason, the clock pulse signal $\phi_p$ (FIG. 6D) is supplied to the base electrode of the transistor 35 to drive the same on for a brief period immediately before the output signal current $i_{sout}$ flows. Consequently, the capacitor 36 is discharged before being partially charged up by the output signal current $i_{sout}$. Thus, the load capacitor 304 has an output waveform $v_{sout}$ as shown in FIG. 6E. Here, if the discharging ON time of the transistor 35, as governed by the pre-charge signal $\phi_p$ is $\tau_A$, the final output voltage $v_{sout}$ appearing at the one plate of the capacitor 36 becomes:

$$V_{sout} = \frac{1}{C_p} \int_0^{\tau_A} i_{sout} \, dt \tag{19}$$

$$= \frac{1}{C_p} \cdot \frac{A_3 \cdot A_4}{A_1 \cdot A_2} \cdot \frac{I_0}{I_c} \times$$

$$\int_0^{\tau_A} \frac{Q_S}{r_{e2}(C_V + C_H)} \cdot \exp - \frac{t}{r_{e2}(C_V + C_H)} \, dt$$

If the ON time $\tau_A$ is set to a value sufficiently greater than the time constant $r_{e2}(C_D + C_H)$, then the integral term in the equation (19) above is nearly equal to $Q_S$, and the output voltage $v_{sout}$ results as follows:

$$V_{sout} = \frac{1}{C_p} \cdot \frac{A_3 \cdot A_4}{A_1 \cdot A_2} \cdot \frac{I_O}{I_C} \cdot Q_s \quad (20)$$

As is apparent from the above equation (20), if the capacitance $C_p$ of the load capacitor 36 is small, the emitter area ratio $$\frac{A_3 \cdot A_4}{A_1 \cdot A_2}$$

is large, and the constant current $I_0$ is also sufficiently large, compared with the gain-control constant current $I_C$, the circuit 10 can attain a high gain, and this gain can be easily controlled by selecting appropriate values of the constant current $I_C$.

Figure 6F:
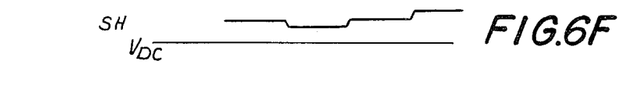

Furthermore, because the output waveform $v_{out}$, as shown in FIG. 6E, is generally stable at a point just prior to the leading edge of the pre-charge pulse signal $\phi_p$, a sample-hold operation can be carried out at the times indicated by vertical arrows in FIG. 6E, to produce a sampled and held voltage SH as shown in FIG. 6F.

Figure 7:
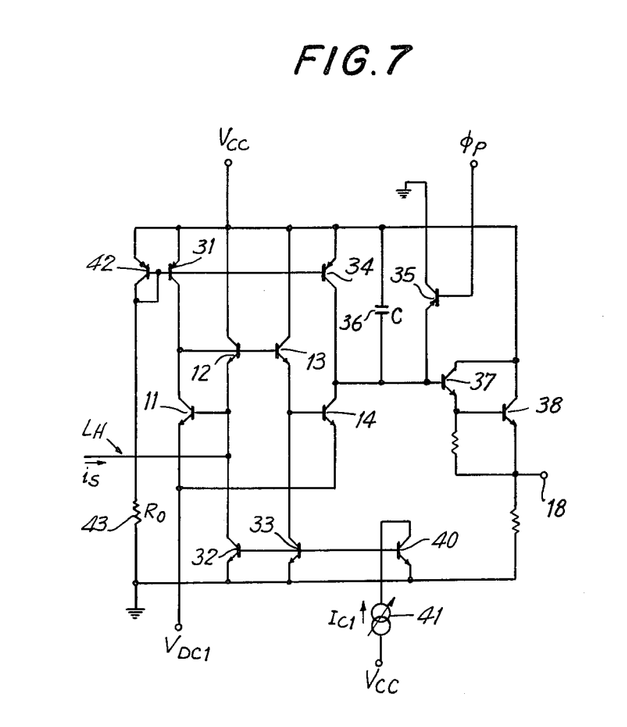
FIGS. 7 and 8 are schematic diagrams illustrating fourth and fifth embodiments of this invention, respectively.

FIG. 7 illustrates a fourth embodiment of this invention, wherein each of the current sources 21, 22, 23, and 24 are constructed of respective junction transistors 31, 32, 33, and 34. In particular, PNP transistors 31 and 34 are employed as the constant current sources for supplying the DC current $I_0$ to the collectors of the transistors 11 and 14, while NPN transistors 32 and 33 supply an adjustable constant current $I_C$ to the emitters of the transistors 12 and 13, respectively.

The transistors 32 and 33 have their collectors coupled to the emitters of the respective transistors 12 and 13, and have their emitters coupled together to ground. These transistors 32 and 33 have their bases connected to the base of a drive transistor 40, which has its collector joined to its base and to a controllable current source 41 supplying a control current $I_{C1}$ thereto. The emitter of this drive transistor 40 is connected to ground.

The transistors 31 and 34 have their collectors connected respectively to the collectors of the transistors 11 and 14, and have their emitters connected together to the point of collector voltage $V_{CC}$. These transistors 31 and 34 have their bases joined together to the base of a drive transistor 42 whose emitter is connected to the voltage $V_{CC}$ and whose collector is joined to its base, and is also coupled through a collector resistor 43 of value $R_0$ to ground.

The transistors 42, 31, and 34 form a first current mirror circuit for supplying current to the transistors 11 and 14, while the transistors 32, 33, and 40 form a second current mirror circuit for supplying current to the transistors 12 and 13.

In the above-described embodiment, if the transistors 31, 32, 33, 34, 42, and 40 have respective emitter areas of $A_{31}$, $A_{32}$, $A_{33}$, $A_{34}$, $A_{42}$, and $A_{40}$, the output signal current $i_{sout}$ can be obtained substantially free of any DC current component, if following relationship are established:

$$\frac{A_{34}}{A_{31}} = \frac{A_3 \cdot A_4}{A_1 \cdot A_2} \quad (21)$$

$$A_{32} = A_{33} = A_{40}$$

In addition, if the transistor 42 has a base-emitter voltage of $V_{BE}$, and the resistor 43 has a resistance value of $R_0$, the DC constant current $I_0$ flowing to the collector of the transistor 11, will have a value established as follows:

$$I_0 = \frac{V_{CC} - V_{BE}}{R_O} \cdot \frac{A_{31}}{A_{42}} \quad (22)$$

Figure 8:
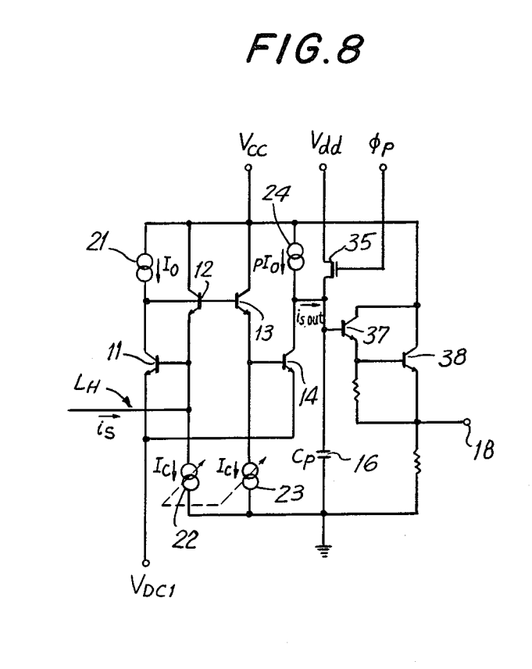

FIG. 8 illustrates a fifth embodiment of this invention which is generally similar to the third embodiment, but wherein the bipolar transistor 35 is replaced with an MOS field effect transistor 35F. The transistor 35F, operated in a non-saturation mode, has its drain electrode connected to a source of drain potential $V_{dd}$, its source electrode coupled to the one plate of the load capacitor 36, and its gate electrode coupled to receive the pre-charge pulses $\phi_p$.

Figure 9:
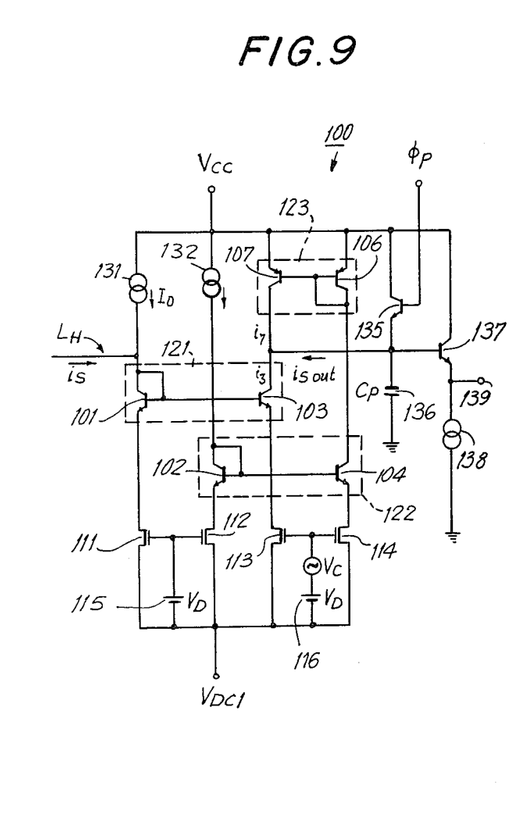
FIG. 9 is a schematic diagram illustrating a sixth embodiment of this invention.

FIG. 9 shows a sixth embodiment of this invention, in which a gain-controlled amplifier 100 is supplied with the input signal current $i_s$ from the MOS imager 1. In this gain-controlled amplifier 100, three current mirror circuits are employed to form a double-balance arrangement wherein any DC component of the output signal current $i_{sout}$ is eliminated.

In this embodiment, first and second diode-arranged NPN transistors 101 and 102 have their bases joined to the bases of respective NPN transistors 103 and 104. The transistor 104 has its collector joined to the collector of a diode-arranged PNP transistor 106, while the transistor 104 has its collector coupled to the collector of another transistor 107, whose base is joined to the base and collector of the transistor 106. These PNP transistors have their emitters joined to a source of potential $V_{CC}$, while the emitters of the transistors 101 and 104 are coupled to another reference voltage $V_{DC1}$ by means of source-drain paths of respective MOS transistors 111, 112, 113, and 114. The MOS transistor 111 and 112 have their gate electrodes connected to a common DC bias voltage source 115 supplying a DC voltage $V_D$ thereto to maintain these transistors 111 and 112 in a non-saturation state. The MOS transistors 113 and 114 have their gate electrodes connected in common to a series combination of a DC bias voltage source 116, which supplies the DC voltage $V_D$, and a gain-control voltage source 117, which supplies a controlled variable voltage $v_c$.

It should be appreciated that the transistors 101 and 103 form a first current mirror circuit 121, the transistors 102 and 104 form a second current mirror circuit 122, and the transistors 106 and 107 form a third current mirror circuit 123. In these current mirror circuits, the transistors 101, 102, and 106 act as input transistors, while the other transistors 103, 104, and 107 act as output transistors.

Here, constant current sources 131 and 132 each supply a constant current $I_0$ to the collectors of the input transistors 101 and 102, respectively.

In this embodiment, the collector of the input transistor 101 of the first current mirror circuit 121 is coupled to the horizontal signal transmitting line $L_H$ to receive the input signal current $i_s$. Accordingly, the output transistor 103 of the first current mirror circuit 121 is the point at which the output signal current $i_{sout}$ appears.

Similarly to the foregoing third, fourth, and fifth embodiments, a pre-charging transistor 135 and a load capacitor 136 are coupled to the collector of the transistor 103, and are followed by an isolation stage formed of an emitter-follower NPN transistor 137 connected in series with a current source 138. The emitter of the transistor 137 then supplies an isolated output signal to an output terminal 139.

The operation of this circuit can be explained with reference to FIGS. 10A to 10F. To simplify the explanation, it will be assumed that the transistors 101 to 104, 106, and 107 have identical characteristics, and that the MOS transistors 111 to 114 also have identical characteristics. However, this condition is not necessary to practice this invention.

Each of the transistors 101 to 104 has an emitter current $I_1$ to $I_4$, respectively, flowing therethrough. Initially, if each of the MOS transistors 111 to 114 has a respective source-to-drain resistance of $R_{11}$, $R_{12}$, $R_{13}$, and $R_{14}$, the collector current $I_3$ of the transistor 103 can be established as $$I_3 = (I_0 + i_s) \frac{R_{11}}{R_{13}} \tag{23}$$

The source-to-drain resistances $R_{11}$ to $R_{14}$ can be established according to the following relationships $$R_{11} = R_{12} = \frac{1}{2\beta} (V_D + V_{th}) \tag{24}$$

$$R_{13} = R_{14} = \frac{1}{2\beta} (V_D + V_C - V_{th}) \tag{25}$$

in which $\beta$ is the gain characteristic of the MOS transistors, and can be expressed as follows $$\beta = \frac{\mu_N \epsilon_{ox}}{2 t_{ox}} \left( \frac{W}{L} \right) \tag{25}$$

wherein $\mu_N$ is the channel carrier mobility, $\epsilon_{ox}$ and $t_{ox}$ are the dielectric constant and layer thickness of the oxide insulation layer on the gate region of the MOS transistor, respectively, and W and L are the gate width and gate length thereof, respectively. In the above relationship 24 and 25, $V_{th}$ is the threshold voltage for each of the MOS transistors.

The collector current $I_7$ flowing through the transistor 107 can be expressed as follows:

$$I_7 = I_0 \frac{R_{12}}{R_{14}} \tag{27}$$

From a consideration of both the foregoing equations (27) and (23), the output signal current $i_{sout}$ flowing into the load capacitor 136, is just the difference between the currents $I_3$ and $I_7$, and can be expressed as follows:

$$i_{sout} = I_3 - I_7 \tag{28}$$

$$= (I_0 + i_s) \frac{R_{11}}{R_{13}} - I_0 \frac{R_{12}}{R_{14}}$$

$$= i_s \cdot \frac{V_D + v_c - V_{th}}{V_D - V_{th}}$$

$$= i_s \left( 1 + \frac{v_c}{V_D - V_{th}} \right)$$

Thus, the output signal current $i_{sout}$ will be provided substantially free of any DC components, and the gain of the cirucit 100 will be substantially proportional to the level of the gain control voltage $v_c$.

Figures 10A, 10B:
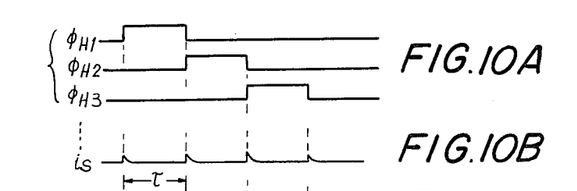
FIGS. 10A to 10F are waveform charts for explaining operation of the sixth embodiment of this invention.
Figures 10C, 10D:
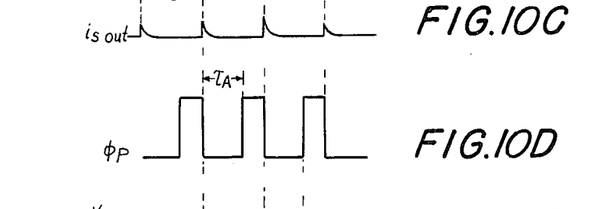
Figure 10E:
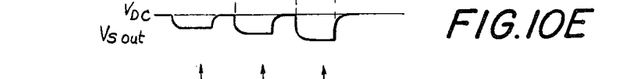
Figure 10F:
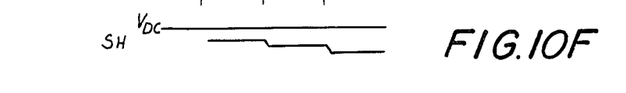

Similarly to the third embodiment (FIG. 5), in response to the leading edges of the horizontal scanning pulses $\phi_{h1}$, $\phi_{h2}$, $\phi_{h3}$ (FIG. 10A), a differential input signal current $i_s$ (FIG. 10B) flows into the collector of the input transistor 101 of the first current mirror circuit, and an amplified output signal current $i_{sout}$ (FIG. 10C) flows from the collector of the output transistor 103. If, as shown in FIG. 10D, the pre-charging pulse $\phi_p$ has a period $\tau_A$ representing the separation between successive ON times of the transistor 135, an output signal voltage $v_{sout}$ will appear on the one plate of the load capacitor 136, and the same can be sampled at the times indicated by vertical arrows to provide a sampled and held signal SH as shown in FIG. 10F.

Similarly to the third embodiment discussed hereinabove, it should be apparent that the output voltage $v_{sout}$ appearing at the output terminal 139 will have a value which can be calculated as follows:

$$v_{sout} = \frac{1}{C_p} \int_0^{\tau_A} i_{sout} \, dt \tag{29}$$

$$= \frac{1}{C_p} \left( 1 + \frac{v_c}{V_d - V_{th}} \right) \times$$

$$\int_0^{\tau_A} \frac{Q_S}{R_{11}(C_H + C_V)} \cdot \exp - \frac{t}{R_{11}(C_H + C_V)} \, dt$$

$$= \frac{1}{C_p} \left( 1 + \frac{v_{CC}}{V_D - V_{th}} \right) \cdot Q_S$$

In the above embodiment, it has been assumed that the MOS transistors 111 to 114 have identical characteristics. However, assuming that the ratio of gate widths to gate lengths of the MOS transistors 111 and 112 are equal to a value $(W/L)_{IN}$, while the ratio of the gate widths to the gate lengths of the MOS transistors 113 and 114 are equal to a value $(W/L)_{OUT}$, the foregoing equation (29) becomes $$v_{sout} = \frac{1}{C_p} \left( 1 + \frac{v_C}{V_D - V_{th}} \right) \cdot \frac{(W/L)_{OUT}}{(W/L)_{IN}} \cdot Q_s \tag{30}$$

From this equation (30), it should be apparent that by setting the ratio $(W/L)_{OUT}$ to the value $(W/L)_{IN}$ to be large, a large-amplitude signal output can be readily obtained.

Figure 11:
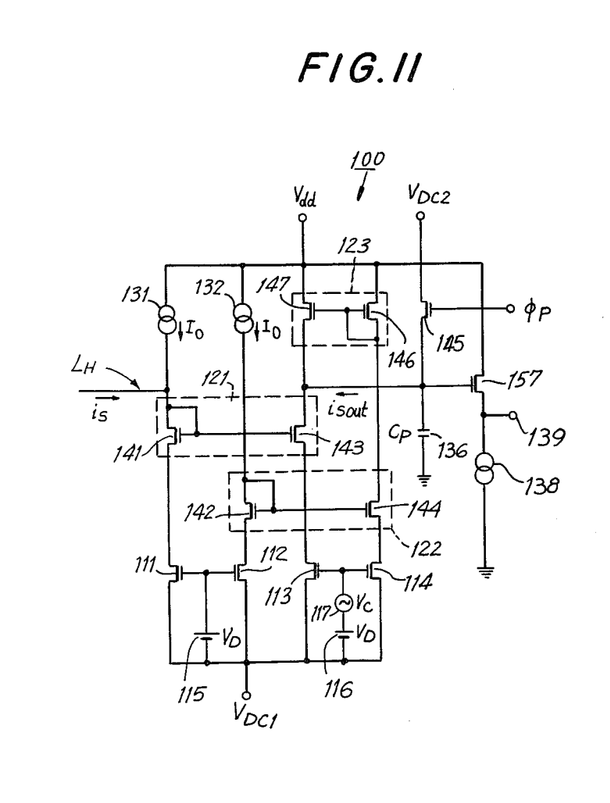
FIGS. 11 to 13 are schematic diagrams of a pertinent portion of seventh, eighth, and ninth embodiments.

FIG. 11 illustrates a seventh embodiment of this invention, in which the gain-control circuit 100 is generally similar to that of the embodiment of FIG. 9, except that MOS transistors 141, 142, 143, 144, 145, 146, 147, and 157 are used in place of the junction transistors 101, 102, 103, 104, 135, 106, 107, and 137 of the sixth embodiment. In this embodiment, the MOS transistors 141 to 145 are N-channel type transistors, while the MOS transistors 146 and 147 are P-channel type transistors.

In this seventh embodiment, the output voltage $v_{sout}$ appearing at the one plate of the load capacitor 136 can be expressed as follows, where the MOS transistors 141 and 143 have transconductances of $g_{m1}$ and $g_{m3}$, respectively, and the MOS transistors 111 and 113 have source-to-drain resistances of $R_{11}$ and $R_{13}$, respectively:

$$v_{sout} = \frac{Q_S}{C_p} \cdot \frac{\frac{1}{g_{m1}} + R_{11}}{\frac{1}{g_{m3}} + R_{13}} \tag{31}$$

The operation and advantages of this embodiment are similar to those of the aforementioned sixth embodiment. However, because the gain-control amplifier 100 is constituted entirely of MOS transistors, the entire image pickup apparatus can be integrated on a single semiconductor chip, and the same MOS construction echniques used to prepare the MOS imager 1 can also be used to prepare the MOS gain-controlled current amplifier 100.

Figure 12:
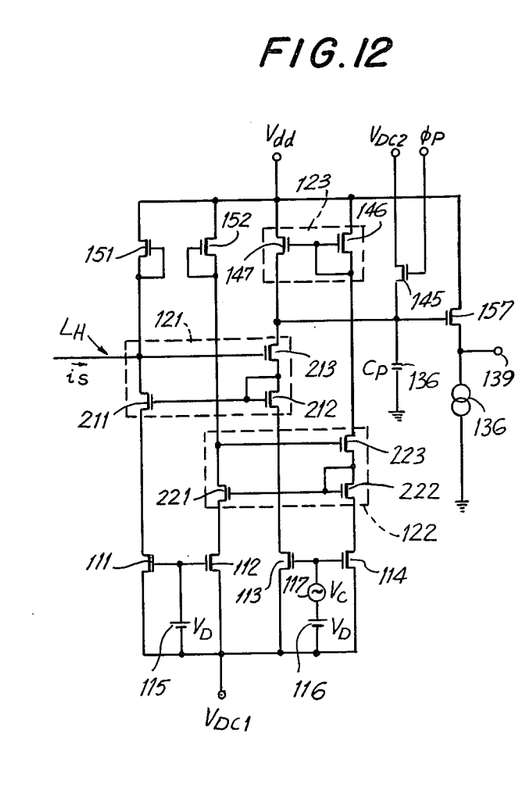

FIG. 12 illustrates an eighth embodiment of this invention, which is generally similar to the FIG. 7 embodiment, but wherein depletion-type field effect transistors 151 and 152 respectively form constant current sources providing the constant current $I_0$ to the input transistors of the first and second current mirror circuits, 121 and 122, respectively. Also, in this embodiment, the current mirror circuits 121 and 122 are feedforward current mirror circuits. That is, the first current mirror circuit 121, has an input MOS transistor 211 and a pair of output MOS transistors 212 and 213 connected in series. The second current mirror circuit 122 also has an input MOS transistor 221 and a pair of output MOS transistors 222 and 223 connected in series. The transistors 211 and 212 have gate electrodes coupled to each other and also to the drain electrode of the transistor 212, while the gate electrode of the transistor 213 is connected to the drain electrode of the transistor 211. Similarly, in the second current mirror circuit, the gate electrodes of the MOS transistors 221 and 222 are coupled together to the drain electrode of the MOS transistor 222 and the source electrode of the transistor 223, while the gate electrode of the transistor 223 is coupled to the drain electrode of the MOS transistor 221.

This embodiment has the advantage of a higher speed of operation than the foregoing embodiments, because of its feed-forward construction in the first and second current mirror circuits 121 and 122.

Figure 13:
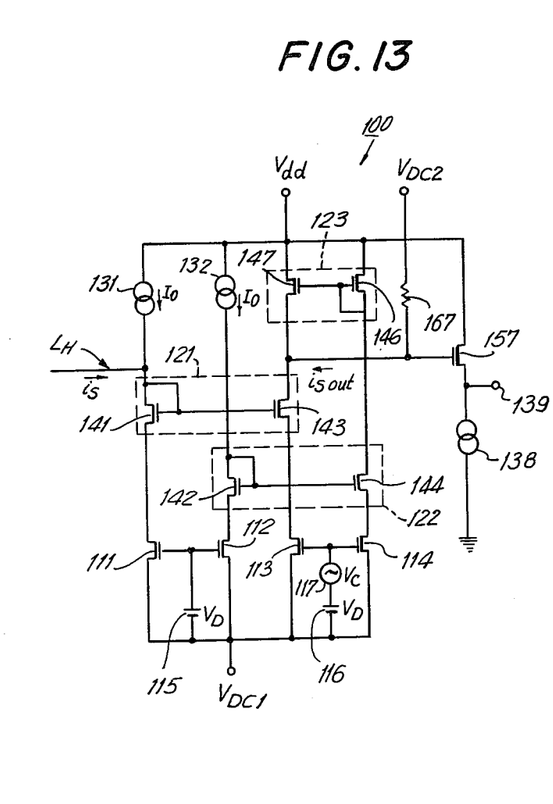

FIG. 13, which is on the same sheet as FIG. 4, shows a ninth embodiment of this invention. In this embodiment, the elements shown are generally the same as in the seventh embodiment, expect that a load resistor 167 extends between a source of DC voltage $V_{DC2}$ and the drain electrode of the output MOS transistor 143 of the first current mirror circuit 121. Here, the load capacitor 136 and the pre-charging transistor 145 are omitted. It should be appreciated that in this embodiment, only the AC output signal $i_{sout}$ flows through the resistor 167, and, therefore, the source of the DC voltage $V_{DC2}$ need not be closely controlled.

While several embodiments of this invention have been described in detail hereinabove, it is urged that the embodiments are representative only, and that many modifications and variations thereof will be apparent to those skilled in the art without departing from the scope and spirit of this invention, as defined in the appended claims.

What is claimed is:

1. Image pickup apparatus comprising a plurality of picture element units each formed of a photosensitive member generating a quantum of electrical charge depending on the amount of light falling thereon, and an electrically controlled gating circuit for transmitting the generated amount of charge in response to scanning pulses applied thereto, said picture element units being disposed in a two-dimensional array of horizontal rows and vertical columns; scanning circuit means for sequentially providing said scanning pulses to the gating circuits of the respective picture element units; and output circuit means coupled to receive the electrical charges in sequence from said picture element units to produce a video signal, wherein said output circuit means includes a gain-controlled current amplifier having a signal input receiving said electrical charges as an input signal current, an output providing an amplified output signal current whose strength is related to that of the input signal current by a current current gain of the gain-controlled current amplifier, and a controllable element for selectively adjusting said gain in accordance with a control signal applied thereto.

2. Image pickup apparatus according to claim 1, wherein said gain-controlled amplifier includes first, second, third, and fouth transistors, each having a first current-carrying electrode, a second current-carrying electrode, and a control electrode, with said second and third transistors having their first current-carrying electrodes coupled together to one point of voltage, having their control electrodes coupled together to the first current-carrying electrode of said first transistor, and having their second current-carrying electrodes coupled to the control electrodes of said first and fourth transistors, respectively, the first and fourth transistors having their second current-carrying electrodes coupled together to another point of voltage; a current source coupled between said one point of voltage and the first current-carrying electrode of said first transistor to provide a constant current thereto; load means coupled between said one point of voltage and the first current-carrying electrode of said fourth transistor; and adjustable current source means providing adjustable constant currents to said second current-carrying electrodes of said second and third transistors, respectively; with said input signal current being supplied to said control electrode of said first transistor and said amplified output signal current appearing at said first current-carrying electrode of said fourth transistor.

3. Image pickup apparatus according to claim 2, wherein said picture element units and said first through fourth transistors are all formed as an integrated circuit on one semiconductor chip.

4. Image pickup apparatus according to claim 2, wherein said load means includes a load resistor.

5. Image pickup apparatus according to claim 2, wherein said load means includes a further current source coupled to the first current-carrying electrode of said fourth transistor providing a constant current thereto, and another load element coupled to such first current-carrying electrode of said fourth transistor.

6. Image pickup apparatus according to claim 5, wherein sad other load element includes a load capacitor having one plate coupled to the first current-carrying electrode of said fourth transistor and another plate coupled to a reference point, and a pre-charging transistor having a first current-carrying electrode connected to a voltage reference point, a second current-carrying electrode coupled to said one plate of said load capacitor, and a control electrode connected to receive a switching pulse.

7. Image pickup apparatus according to claim 6, further comprising an output isolation stage having an input coupled to said one plate of the load capacitor and an output.

8. Image pickup apparatus according to claim 7, wherein said output isolation stage includes a darlington pair of transistors having a control electrode coupled to said one plate of the load capacitor and an output electrode connected to said output of the isolation stage.

9. Image pickup apparatus according to claim 6, wherein said pre-charging transistor includes an MOS transistor having source and drain electrodes as its current-carrying electrodes and a gate electrode as its control electrode.

10. Image pickup apparatus according to claim 1, wherein said gain-controlled amplifier includes first, second, third, and fourth junction transistors each having a collector, an emitter, and a base, with the second and third transistors having their collectors coupled together to one point of voltage, having their bases coupled together to the collector of said first transistor, and having their emitters coupled to the bases of the first and fourth transistors, respectively, the first and fourth transistors having their emitters coupled together to another point of voltage; one current source coupled between said one point of voltage and the collector of the first transistor to provide a constant current thereto; load means coupled to the collector of the fourth transistor; and adjustable current source means providing adjustable constant currents to the emitters of the second and third transistors, respectively; with said nput signal current being applied to the base of the first transistor and the output signal current appearing at the collector of the fourth transistor.

11. Image pickup apparatus according to claim 10, wherein said load means includes a further current source coupled to the collector of said fourth transistor providing a constant thereto, and another load element coupled to such collector of said fourth transistor.

12. Image pickup apparatus according to claim 11, wherein said first, second, third, and fourth transistors are formed with respective emitter areas $A_1$, $A_2$, $A_3$, and $A_4$, said one current source provides the constant current $I_0$ to the collector of the first transistor, and the further current source provides the constant current to the collector of the fourth transistor at a level $I_{4C}$, where $$I_{4C} = \frac{A_3 \cdot A_4}{A_1 \cdot A_2} \cdot I_0.$$

13. Image pickup apparatus according to claim 11, wherein said one and said further current sources are formed of respective one and further transistors each having an emitter connected to said one point of voltage and a collector joined to the collector of a respective one of said first and fourth transistors, and having their bases joined together; and further comprising a diode-connected transistor having an emitter joined to said one point of voltage, a base connected to a collector thereof and to the bases of the one and further transistors, and a resistor connected between the collector of said diode-connected transistor and another point of voltage.

14. Image pickup apparatus according to claim 10, wherein said adjustable current source means includes a current mirror circuit formed of fifth, sixth, and seventh transistors, each having a collector, an emitter, and a base, with their emitters joined together to a reference point, their bases joined together, the collectors of the fifth and sixth transistors being joined to the emitters of the second and third transistors, respectively, and the collector of the seventh transistor being joined to the base thereof; and a controllable current source coupled to the joined-together bases of the fifth, sixth, and seventh transistors.

15. Image pickup apparatus according to claim 1, wherein said plurality of picture element units provides said input signal current as a time-shared sampled signal.

16. Image pickup apparatus according to claim 1, wherein said gain-controlled current amplifier includes first, second, and third current mirror circuits each formed of an input transistor device and an output transistor device, each transistor device having first and second current-carrying electrodes and a control electrode, with the control electrodes of both said transistor devices of each said current mirror circuit being joined together, the current mirror circuits being arranged so that current flowing into the first current-carrying electrode of the output transistor device thereof changes in accordance with a current flowing into said first current-carrying electrode of the input transistor device thereof; current source means providing substantially equal constant currents to the first current-carrying electrodes of the input transistor devices of said first and second current mirror circuits, respectively; the first current-carrying electrodes of the output and input transistor devices of the third current mirror circuit being joined to the first current-carrying electrodes of the output transistor devices of said first and second current mirror circuits, respectively, the second current-carrying electrodes of the transistor devices of the third current mirror circuit being coupled to a point of reference potential; first and second resistive means coupled to establish substantially equal fixed resistances between a reference point and the second current-carrying electrodes of the input transistor devices of said first and second current mirror circuits, respectively; and third and fourth resistive means coupled to establish substantially equal variable resistances between the reference point and the second current-carrying electrodes of the output transistor devices of said first and second current mirror circuits, respectively; with said input signal current being applied at the first current-carrying electrode of the input transistor device of said first current mirror circuit and with said amplified output signal current appearing at the first current-carrying electrode of the output transistor device of said first current mirror circuit.

17. Image pickup apparatus according to claim 16, wherein said first, second, third, and fourth resistive means each include a respective first, second, third, and fourth MOS transistor having source and drain electrodes coupled in series between said reference point and the second current-carrying electrodes of the input transistor device of said first current mirror circuit, the input transistor device of said second current mirror circuit, the output transistor device of said first current mirror circuit, and the output transistor device of said second current mirror circuit, respectively, and each said MOS transistor also having a gate electrode; and further comprising a fixed bias source coupled to the gate electrodes of said first and second MOS transistors and a selectively variable bias source coupled to the gate electrodes of said third and fourth MOS transistors.

18. Image pickup apparatus according to claim 16, wherein the input and output transistor devices for said first, second, and third current mirror circuits each include a junction transistor having a collector, an emitter, and a base as its first current-carrying electrode, second current-carrying electrode, and control electrode, respectively, with the collector and base of each input transistor being coupled together.

19. Image pickup apparatus according to claim 18, wherein the junction transistors of said first and second current mirror circuits are all of one type and the junction transistors of said third current mirror circuit are both of another, complementary type.

20. Image pickup apparatus according to claim 16, wherein the input and output tansistor devices for said first, second, and third current mirror circuits each include an MOS transistor having a drain electrode, a source electrode, and a gate electrode serving as its first current-carrying electrode, its second current-carrying electrode, and its control electrode, respectively.

21. Image pickup apparatus according to claim 20, wherein said MOS transistors for said first and second current mirror circuits are of one of an N-channel and a P-channel type; while the MOS transistors for said third current-mirror circuit are of the other of said N-channel and said P-channel type.

22. Image pickup apparatus according to claim 20, wherein the output transistor device for each said current mirror circuit includes a first and an additional MOS transistor having source, drain, and gate electrodes, with the source and drain electrodes of the additional MOS transistor being coupled in series with the drain electrode of the first MOS transistor, and with the gate electrode of the additional MOS transistor being connected to the drain electrode of the input MOS transistor, such that each said current mirror circuit operates as a feed-forward circuit.

23. Image pickup apparatus according to claim 16, further comprising a load capacitor having one plate coupled to the first current-carrying electrode of the output transistor device of said first current mirror circuit, and another plate coupled to a reference point; and a pre-charging transistor having a first current-carrying electrode coupled to a source of charging voltage, a second current-carrying electrode coupled to said one plate of the load capacitor, and a control electrode coupled to receive a switching pulse.

* * * * *